US010514435B2

(12) United States Patent
Steiner et al.

(10) Patent No.: US 10,514,435 B2
(45) Date of Patent: Dec. 24, 2019

(54) APPARATUS FOR CALIBRATING A POWER MEASURING SYSTEM FOR POWER TRANSFORMERS

(71) Applicant: MASCHINENFABRIK REINHAUSEN GMBH, Regensburg (DE)

(72) Inventors: Thomas Steiner, Radebeul (DE); Catrina Kowal, Dresden (DE); Sebastian Augat, Spremberg (DE); Andreas Thiede, Schoenborn/Langebrueck (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 745 days.

(21) Appl. No.: 14/405,005

(22) PCT Filed: Apr. 18, 2013

(86) PCT No.: PCT/EP2013/058104
§ 371 (c)(1),
(2) Date: Dec. 2, 2014

(87) PCT Pub. No.: WO2013/185958
PCT Pub. Date: Dec. 19, 2013

(65) Prior Publication Data
US 2015/0145526 A1 May 28, 2015

(30) Foreign Application Priority Data
Jun. 12, 2012 (DE) .................. 10 2012 105 045

(51) Int. Cl.
*G01R 35/00* (2006.01)
*G01R 31/02* (2006.01)

(52) U.S. Cl.
CPC ......... *G01R 35/005* (2013.01); *G01R 31/027* (2013.01)

(58) Field of Classification Search
CPC ...... G01R 35/00; G01R 31/02; G01R 31/027; G01R 21/133; G01R 35/04; G01R 35/005
See application file for complete search history.

(56) References Cited

U.S. PATENT DOCUMENTS 3,947,725 A * 3/1976 Lucas ................. H02H 7/05
324/126
4,795,969 A 1/1989 So
(Continued)

FOREIGN PATENT DOCUMENTS

| GB | 2504899 A | 2/2014 | |
|----|-----------|--------|---|
| WO | 1997015806 A | 5/1997 | |
| WO | WO 9715806 A1 * | 5/1997 | ............. G01R 35/04 |

*Primary Examiner* — Neel D Shah
*Assistant Examiner* — Brent J Andrews
(74) *Attorney, Agent, or Firm* — Andrew Wilford

(57) ABSTRACT

The present invention relates to an apparatus for calibrating a power measuring system for power transformers. The general inventive concept involves the two reference measuring systems that are known from the prior art for the calibration of a current transformer, a voltage transformer and an evaluation device being integrated in a shared apparatus, according to the invention, for calibrating a power measuring system for power transformers, which apparatus is furthermore arranged on a container such that the apparatus can be moved by means of a trailer that holds the container for the purpose of in-situ calibration of the power measuring system of power transformers.

8 Claims, 2 Drawing Sheets

(56) References Cited

U.S. PATENT DOCUMENTS

| | | |
|---|---|---|
| 6,608,493 B2 | 8/2003 | Hensler |
| 6,864,674 B2 | 3/2005 | Brewer |
| 7,961,112 B2 | 6/2011 | Wells |
| 2005/0199386 A1* | 9/2005 | Kinzer ................ E21B 43/2401 166/248 |
| 2012/0019962 A1* | 1/2012 | Faxvog .................. H02H 3/52 361/1 |
| 2012/0062249 A1* | 3/2012 | Shamir ................ G01R 15/186 324/679 |

* cited by examiner

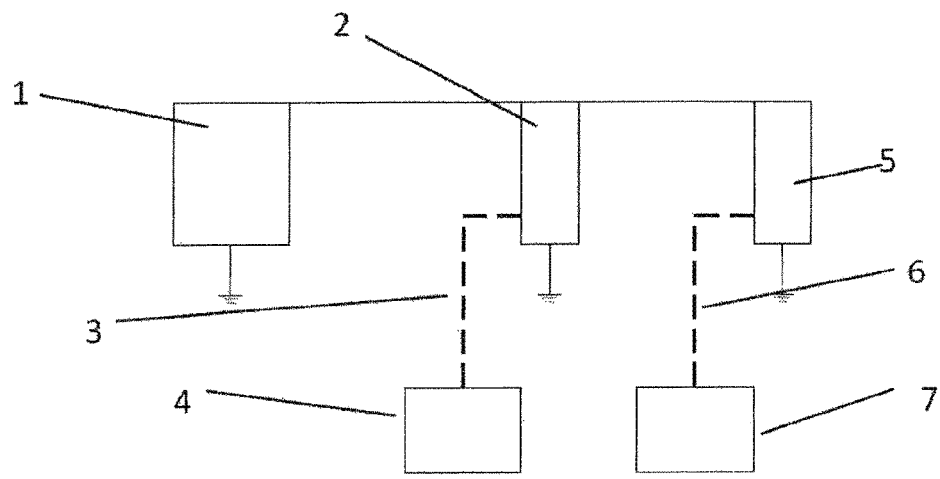
Fig. 1 - Prior Art
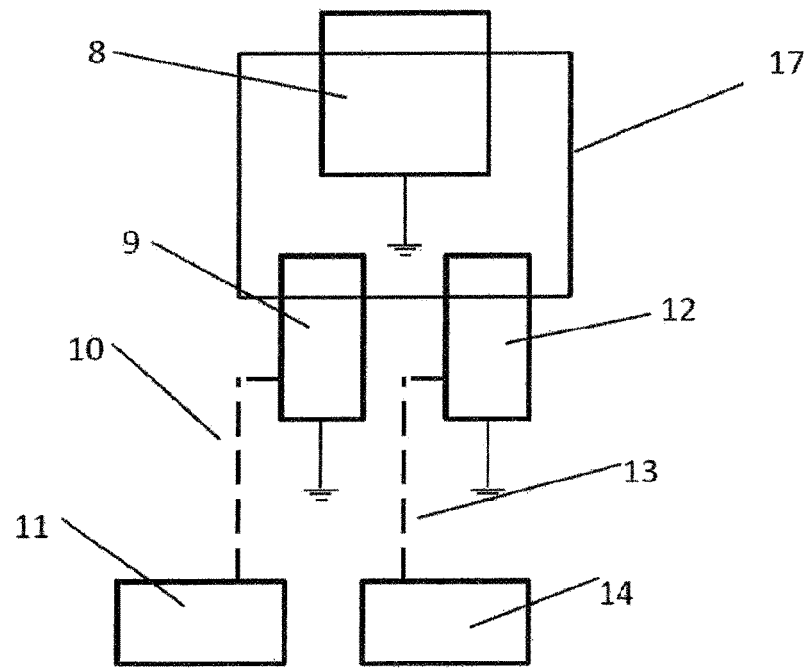
Fig. 2 - Prior Art

APPARATUS FOR CALIBRATING A POWER MEASURING SYSTEM FOR POWER TRANSFORMERS

CROSS REFERENCE TO RELATED APPLICATIONS

This application is the US-national stage of PCT application PCT/EP2013/058104 filed 18 Apr. 2013 and claiming the priority of German patent application 102012105045.7 itself filed 12 Jun. 2012.

FIELD OF THE INVENTION

The present invention relates to an apparatus for calibrating a power measurement system for a power transformer.

Minimization of power dissipation is a very important criterion when employing power transformers in a power supply network. Power dissipation, which is reflected for instance in no-load losses or load losses, is a design- and/or production-dependent factor, and it is therefore checked by the routine and type test for a power transformer according to IEC Standard 60076-1 or IEEE Standard C57.12.90-1999. The amount of power dissipation has a direct impact on costs for the energy provider, and it is therefore monetarily penalized against the producer when the power transformer is purchased. For this reason, the power dissipation should be assessed as accurately as possible on purchasing a power transformer. Every high-voltage testing laboratory for a power transformer therefore has a so-called power measurement system that has to be calibrated in order to determine the power dissipation of the power transformer and measure it as accurately as possible by means of the power measurement system. It is moreover required by IEC Standard 60060-2 that such a power measurement system be calibrated.

Such power measurement systems as known from the prior art have sub-components that include a current and voltage source, a voltage transformer, a current transformer, a test object, namely the power transformer, and an evaluation device. In order to ensure that the values measured by the power measurement system are adequately accurate, it is in particular necessary to calibrate the current transformer, the voltage transformer, and the evaluation device. In this context, it is common practice to perform a time- and cost-consuming, component-specific, individual calibration on the mentioned sub-components of the power measurement system, i.e. on the current transformer, the voltage transformer, and the evaluation device. For this purpose, the sub-components current transformer, voltage transformer, and evaluation device, have to be dismantled from the power measurement system and sent to the respective manufacturers of the sub-components for being calibrated by them. After the individual calibration has been performed on the sub-components, the power measurement system can be completed, i.e. reassembled, again. In a subsequent step, the overall measurement uncertainty of the power measurement system is mathematically deduced from the measurement uncertainties of the individual sub-components calibrated by the manufacturer and is inferred for the entire power measurement system.

For the individual calibration of the sub-components of the power measurement system, prior art uses a so-called reference measurement system. In a reference measurement system, the electrical parameters to be determined or calibrated are standardized to values that represent the reference values, and which are known to the operator. In other words, the reference measurement system serves as reference system with electrical output values that are known to the operator, at defined input values.

FIG. 1 shows the circuit arrangement of a reference measurement system as known from prior art for calibrating sub-components of the voltage transformer. For this purpose, the reference measurement system has a high-voltage transformer 1 as a voltage source, which high-voltage transformer 1 is electrically connected with a reference voltage transformer 2 by power supply lines. The reference voltage transformer 2 is in turn electrically connected with a reference evaluation device 4 by a measuring cable 3. The high-voltage transformer 1 furthermore electrically supplies the actual calibration object, namely a voltage transformer 5 and an evaluation device 7, which calibration object is disposed at the high-voltage transformer 1 in an arrangement that is electrically symmetrical to the reference voltage transformer 2 and the reference evaluation device 4.

FIG. 2 shows the circuit arrangement of another reference measurement system as known from prior art for calibrating a current transformer. For this purpose, a high-current transformer 8 is provided as a current source, which high-current transformer 8 is electrically connected with a reference current transformer 9 by a high-current circuit, which reference current transformer 9 in turn is connected via a reference measurement cable 10 to a reference evaluation device 11. In a symmetrical arrangement therewith, the actual sub-components to be calibrated, namely the current transformer 12, which is connected via a measuring cable 13 with the evaluation device 14, are also connected with the high-current circuit of the high-current transformer 8.

In both reference measurement systems shown in FIGS. 1 and 2, a nominal-actual value comparison is performed, where the physical quantities, or their respective values, which are determined by the reference measurement system, are compared against those of the individual sub-components to be calibrated. In the reference measurement system of FIG. 1 for instance the values determined in the reference voltage transformer 2 and the reference evaluation device 4 are thus compared against those of the calibration object, i.e. the voltage transformer 5 and the evaluation device 7—including, in each case, their corresponding measuring cables 3 and 6.

All in all, the structure of prior art reference measurement systems for calibrating the individual sub-components is thus very cumbersome. On the one hand, the calibration requires using technologically different reference measurement systems, on the other hand, current transformers and voltage transformers have to be sent to the respective manufacturers as individual components for being calibrated.

OBJECT OF THE INVENTION

The object of the present invention is therefore to specify an apparatus for calibrating a power measurement system for a power transformer, which apparatus makes it unnecessary to use different reference measurement systems for calibrating the sub-components of the power measurement system, i.e. current transformer, voltage transformer, and evaluation device, and which apparatus dispenses with sending the sub-components to the manufacturer for being individually calibrated.

SUMMARY OF THE INVENTION

The general inventive idea consists in integrating the two known prior art reference measurement systems for calibrating a current transformer, a voltage transformer, and an evaluation device, into one common apparatus according to the invention for calibrating a power measurement system for a power transformer, which apparatus is moreover arranged on a container in such a manner that the apparatus is constructed to be movable by a trailer, onto which the container is loaded, for performing on-site calibration of the power measurement system for a power transformer. According to the invention, the mobile container thus comprises a completely pre-installed apparatus for calibrating a power measurement system. The apparatus according to the invention installed in the container thus enables calibrating the entire power measurement system by way of system calibration that makes it possible to examine or calibrate the calibrating accuracy of the individual components, and also the influence of the supply lines between the individual components as well as the evaluation algorithm of the evaluation device. The calibration accuracy achieved in this manner is higher than when calibrating the individual components.

Moreover, the individual sub-components of the apparatus according to the invention require no specific preparation when the power measurement system is calibrated; in order to be calibrated, the power measurement system only needs to be connected with the apparatus according to the invention. Thus, the sub-components of the power measurement system that are to be calibrated, namely the current transformer, the voltage transformer, and the evaluation device, also only require one common apparatus according to the invention in order to be calibrated. It is no longer necessary that the current transformer and the voltage transformer are each calibrated individually by the respective manufacturer as is required in prior art; the current transformer and the voltage transformer can rather be calibrated together, on-site, in one single calibration process at the same time, using only one single apparatus according to the invention. Until now, on-site calibration by the separate prior art calibrating systems was not economically feasible, as each calibrating system would have had to be installed on a container and trailer of its own. Two containers, including trailers and towing vehicles, would have thus been necessary in order to be able to perform a calibration of the sub-components. Only by integrating the two reference measurement systems, which in prior art have so far been separate systems, into one common apparatus according to the invention, which is on one container, is on-site calibration of a power measurement system rendered an economically profitable alternative for a test field operator. Also, it has not been technically possible up to now to simply install the separate calibrating systems of a known prior art construction type onto one single, common container, as it could not have been ensured for the respective system components of the corresponding calibration system to be spaced sufficiently apart at the necessary dielectric distances. The apparatus according to the invention has now made this possible for the first time.

It has also been shown that the apparatus according to the invention ensures determining the power dissipation of the power transformer with significantly higher accuracy than the prior art because the hitherto used mathematical deduction of the measurement uncertainty from the measurement uncertainties of the sub-components is dispensed with. This is because it has been recognized that in particular the measuring lines between the current and voltage transformers and the corresponding evaluation device as well as the evaluation algorithm in the evaluation device itself, which evaluation algorithm determines the phase angle between the measured electrical quantities and assesses the power from the quantities current, voltage, and phase angle, have an influence on the measuring result within the power measurement system or the reference measurement system during the calibration of the sub-components. The apparatus according to the invention thus achieves significantly higher measurement accuracy in comparison to the individual calibration of the sub-components of the power measurement system by the known separate reference measurement systems and the subsequent extrapolation of the measuring error to the entire power measurement system. Frequently, the measuring data of the sub-components were also manually measured and consolidated for the entire power measurement system, thus transferring the measuring error of the sub-components into the calibration record of the entire power measurement system that eventually negatively affects the accuracy of the measuring values of the power measurement system.

BRIEF DESCRIPTION OF THE DRAWING

In the following, the invention will be described in more detail by means of embodiment with reference to the drawings, in which:

FIG. 1 is the circuit diagram of a reference measurement system according to the prior art for calibrating a voltage transformer;

FIG. 2 is the circuit diagram of a reference measurement system according to the prior art for calibrating a current transformer;

SPECIFIC DESCRIPTION OF THE INVENTION

Figure 3:
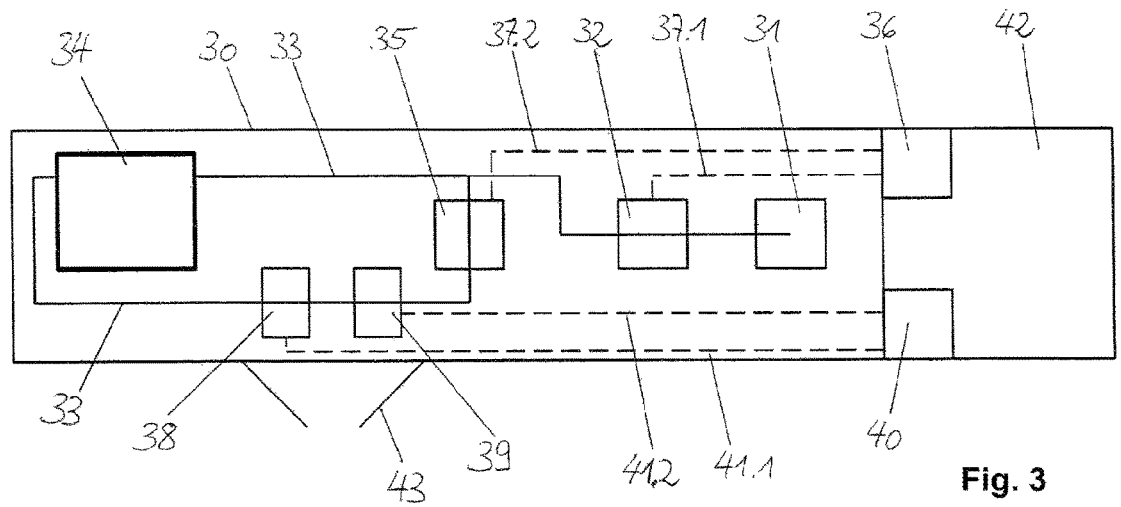
FIG. 3 is the schematic circuit diagram of a first embodiment of an apparatus according to the invention for calibrating a power measurement system of a power transformer.

FIG. 3 the schematic circuit diagram of a first embodiment of an apparatus according to the invention for calibrating a power measurement system of a power transformer in a top plan view of a container 30. The container 30 can be for instance a customary 40-feet standard container that is compatible with and movable by a trailer and towing vehicle. A high-voltage transformer 31 arranged in the rear area of the container 30 serves as voltage source, and it supplies the required test voltage of up to 100 kV for the apparatus according to the invention. A reference voltage transformer 32 is connected with the high-voltage transformer 31 by an electric line. The reference voltage transformer 32, which transforms an input voltage to an output voltage that is known to the test field operator, is in turn electrically connected both with a high-current circuit 33 having a high-current transformer 34, which supplies a maximum test current of 2 kA, and with a reference current transformer 35 that in turn transforms an input current to an output current that is known to the test field operator. Furthermore, a reference evaluation device 36 is electrically connected via reference measuring cables 37.1 and 37.2 both with the reference voltage transformer 32 and the reference current transformer 35, respectively. The reference evaluation device 36, which is also standardized to electrical parameters that are known to the operator, records the signals from the reference current transformer 32 and the reference voltage transformer 35 during the power measurement and uses them to calculate the active power P, the apparent power S, the frequency f, and the phase angle j between applied current and applied voltage. In addition, it is possible to evaluate the harmonic content of the sinusoidal quantities by the reference evaluation device 36. A very common reference evaluation device 36 for power measurement is YOKOGAWA WT3000. In the apparatus according to the invention, the sub-components of the power measurement system that are to be calibrated, namely a voltage transformer 38, a current transformer 39, and an evaluation device 40, are also looped into the high-current circuit 33. Arranged likewise analogous symmetrically with respect to the reference measuring devices, the evaluation device 40 is electrically connected via measuring cables 41.1 and 41.2 both with the voltage transformer 38 and the current transformer 39, respectively. In order to ensure the measurement accuracy of the apparatus according to the invention, the reference evaluation device 36 and the evaluation device 40 to be calibrated are in an electromagnetically shielded control room 42 in the container 30. In the present context, the voltage transformer 38 and the current transformer 39 can be positioned in the container 30 in a particularly simple manner by a door 43, which is preferably designed as a double-wing door, provided in the side wall of the container 30. It has furthermore been shown that placing all system components in the container 30 further improves the measurement accuracy of the apparatus according to the invention because all installed system components are subject to the same climatic conditions due to the air-conditioning inside the container 30.

Figure 4:
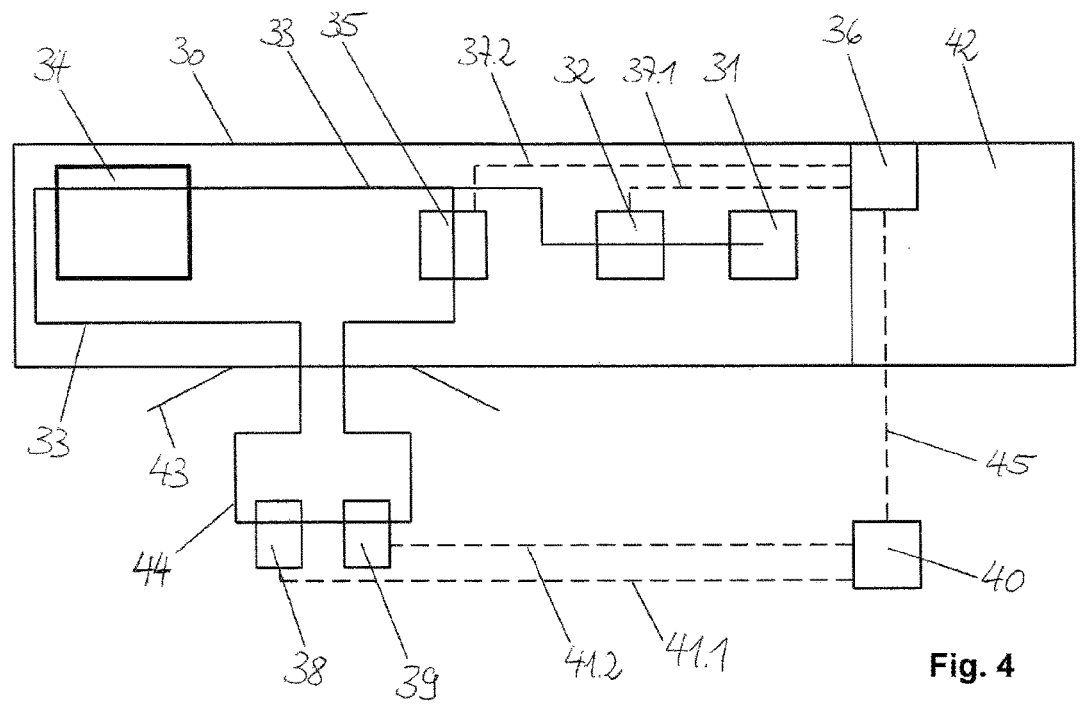
FIG. 4 is the schematic circuit diagram of a further embodiment of an apparatus according to the invention for calibrating a power measurement system of a power transformer.

In contrast to FIG. 3, the voltage transformer 38 and the current transformer 39 in FIG. 4 can be positioned outside of the container 30 by an extendable high-current connection 44. The evaluation device 40, which is also arranged outside of the container 30, is electrically connected with both the voltage transformer 38 and the current transformer 39 via a measuring cable 41.1 and 41.2, respectively, in this embodiment, too. Communication between the reference evaluation device 36 and the evaluation device 40 to be calibrated here is performed by a data connection line 45, for instance by way of a remote control connection.

Current and voltage transformers that can be used in the context of the present invention are known from the book "Hochspannungstechnik (High-Voltage Technology)" by Andreas Küchler, Springer Verlag, 2005. In the prior art, capacitive voltage transformers have proven particularly successful for determining the voltage, whereas inductive current transformers are suited for determining the current.

Such a capacitive voltage transformer as known from prior art is always connected with a current-carrying conductor. More precisely, two series-connected capacitors are connected with a current-carrying conductor. The low-voltage capacitor in a lower housing here is connected with the ground potential. A higher voltage capacitor is in a separate, insulating support tube, and it separates the high voltage potential at the upper housing from the ground potential of the lower housing. The upper housing, which surrounds the connection between the conductor and the higher voltage capacitor, is also at high voltage potential. The voltage at the current-carrying conductor can be determined from the ratio of the two capacitors and the voltage measured at the low-voltage capacitor.

Usually, the current is determined using inductive current transformers. In this instance, a closed, annular iron core with a winding wound around it is around the current-carrying conductor, in which winding a current is induced as soon as the conductor carries a current. A shunt resistor is series-connected with the winding. The current of the conductor can be determined by measuring the current at the shunt resistor. The housing of the apparatus is designed in three parts. The upper housing encloses the current-carrying conductor and is connected with the lower housing via an insulating support tube. The upper housing is at high voltage potential, whereas the lower housing is at ground potential.

The invention claimed is:

1. An apparatus for calibrating a power measurement system for a power transformer, the apparatus comprising a high-voltage transformer, a reference voltage transformer, a high-current circuit, a high-current transformer, a reference current transformer, a reference evaluation device, reference measuring cables, and a common container, wherein, during calibration, the apparatus is connected with a power measurement system that comprises a voltage transformer, a current transformer, and an evaluation device that are looped into the high-current circuit;

wherein the high-voltage transformer supplies a predetermined calibrating voltage;

wherein the reference voltage transformer is electrically connected with the high-voltage transformer, the reference voltage transformer being a capacitive voltage transformer and being in turn electrically connected by the high-current circuit both with the high-current transformer and with the reference current transformer that is an inductive current transformer;

wherein the reference evaluation device is electrically connected via the reference measuring cables both with the reference voltage transformer and the reference current transformer, respectively, and determines the corresponding active power, the apparent power, the frequency, and the phase angle between respectively applied current and applied voltage;

wherein at least the high-voltage transformer, the reference voltage transformer, the high-current circuit, the high-current transformer, the reference current transformer, the reference evaluation device, and the reference measuring cables are within the common container;

wherein a separate, electromagnetically shielded control room is provided within the container, wherein at least the evaluation unit is in the control room; and wherein the voltage transformer, the current transformer, and the evaluation device, are inside an electrically operative connection with the high-current circuit in such a manner that an on-site calibration can be performed on the power measurement system for a power transformer by way of system calibration.

2. The apparatus for calibrating a power measurement system defined in claim 1, wherein the evaluation device is electrically connected both with the voltage transformer and with the current transformer, respectively, via measuring cables.

3. The apparatus for calibrating a power measurement system defined in claim 1, wherein the voltage transformer, the current transformer, and the evaluation device are within the container.

4. The apparatus for calibrating a power measurement system defined in claim 1, wherein the voltage transformer, the current transformer, and the evaluation device are outside of the container.

5. The apparatus for calibrating a power measurement system defined in claim 4, wherein the voltage transformer and the current transformer are electrically looped into the high-current circuit by an extendable high-current connection, and the evaluation device communicates with the reference evaluation device by a data connection.

6. The apparatus for calibrating a power measurement system defined in claim 1, wherein the voltage transformer to be calibrated is a capacitive voltage transformer.

7. The apparatus for calibrating a power measurement system defined in claim 1, wherein a calibrating voltage of 100 kV and higher can be generated by the high-voltage transformer.

8. The apparatus for calibrating a power measurement system defined in claim 1, wherein a maximum test current of several kA can be generated by the high-current transformer.

* * * * *